(12) United States Patent
Kawamura

(10) Patent No.: US 7,785,117 B2
(45) Date of Patent: Aug. 31, 2010

(54) PRINTED CIRCUIT BOARD

(75) Inventor: Yoshihiro Kawamura, Shizuoka (JP)

(73) Assignee: Yazaki Corporation (JP)

( * ) Notice: Subject to any disclaimer, the term of this patent is extended or adjusted under 35 U.S.C. 154(b) by 0 days.

(21) Appl. No.: 11/808,961

(22) Filed: Jun. 14, 2007

(65) Prior Publication Data
US 2008/0038944 A1    Feb. 14, 2008

(30) Foreign Application Priority Data
Aug. 8, 2006   (JP)   .............................. 2006-215665

(51) Int. Cl.
H01R 12/00   (2006.01)
(52) U.S. Cl. ...................................................... 439/79
(58) Field of Classification Search .................. 439/79, 439/76.1, 80, 934
See application file for complete search history.

(56) References Cited

U.S. PATENT DOCUMENTS

| | | | | |
|---|---|---|---|---|
| 5,091,826 A | * | 2/1992 | Arnett et al. ................. | 361/776 |
| 5,183,967 A | * | 2/1993 | Lin .............................. | 174/59 |
| 5,743,765 A | * | 4/1998 | Andrews et al. ............ | 439/608 |
| 5,823,799 A | * | 10/1998 | Tor et al. ...................... | 439/79 |
| 6,425,768 B1 | * | 7/2002 | Taylor .......................... | 439/67 |
| 7,074,053 B2 | * | 7/2006 | Kawakita et al. ........... | 439/76.1 |
| 2001/0049210 A1 | * | 12/2001 | Pinteric et al. ............. | 439/76.1 |
| 2006/0141822 A1 | * | 6/2006 | Ozawa et al. .............. | 439/76.1 |

OTHER PUBLICATIONS

U.S. Appl. No. 11/819,105, filed Jun. 2007, Kawamura Yoshihiro.*

* cited by examiner

*Primary Examiner*—T C Patel
*Assistant Examiner*—Phuong Nguyen
(74) *Attorney, Agent, or Firm*—Finnegan, Henderson, Farabow, Garrett & Dunner, L.L.P.

(57) ABSTRACT

First insulating walls projected from a substrate are interposed between high voltage terminals T+, T−. The first insulating walls are disposed further away from the connector housing than the high voltage terminals T+, T−. The first insulating walls prevent mixed conductive foreign particle from touching the high voltage terminals T+, T− at the same time.

3 Claims, 6 Drawing Sheets

PRINTED CIRCUIT BOARD

CROSS REFERENCE TO RELATED APPLICATIONS

This application is on the basis of Japanese Patent Application No. 2006-215665, the contents of which are hereby incorporated by reference.

BACKGROUND OF THE INVENTION

1. Field of the Invention

The present invention relates to a printed circuit board, and in particular, the printed circuit board having a connector housing mounted on the printed circuit board, positive and negative terminals, and lead wires of the terminals extending from the printed circuit board to the connector.

2. Description of the Related Art

In recent years, a hybrid vehicle (HEV) having an electric motor as a driving force, a fuel cell electric vehicle (FCEV), an electric vehicle (EV) have been spread. Each of these electric vehicles includes two types of batteries: a low voltage battery about 12 volts for starting an engine, and a high voltage battery for driving the electric motor.

A conventional printed circuit board mounted on such an EV is shown in FIG. 8. As shown in FIG. 8, the printed circuit board includes a substrate 10, a connector housing 11 mounted on the substrate 10, and terminal fittings 12 received in terminal insertion holes formed on the connector housing 11. The terminal fittings 12 include a high voltage positive terminal T+ and a high voltage negative terminal T− connected to positive and negative terminals of the high voltage battery. The terminal fittings 12 also include low voltage terminals T1 to T5 connected to the low voltage battery.

One ends of lead wires of the high voltage terminals T+, T− are projected from the terminal insertion holes formed on an upper row of a sidewall of the connector housing 11. The other ends of the lead wires of the high voltage terminals T+, T− are connected to terminals mounted on the substrate 10. One ends of lead wires of the low voltage terminals T1 to T5 are projected from the terminal insertion holes formed on a lower row of the sidewall of the connector housing 11. The other ends of the lead wires of the low voltage terminals T1 to T5 are connected to terminals mounted on the substrate 10. In the connector housing 11, the low voltage terminals T1 to T5 are interposed between the high voltage terminals T+, T−.

Further, a pair of slits 13 is formed between the terminals T+ and T1, and between the terminals T− and T5. These slits 13 are formed for securing isolation between the high voltage terminals T+, T− and the low voltage terminals T1 to T5 by elongating a distance along the substrate 10 therebetween.

Sometimes a conductive foreign particle 14 such as a piece of coil is mixed on the printed circuit board. Consequently, there is a problem when the conductive foreign particle 14 is touched to both the high voltage terminals T+ and T−, the high voltage battery is short-circuited.

Further, when there is a problem when the conductive foreign particle 14 is touched to any one of the high voltage terminals T+, T−, and some of low voltage terminals T1 to T5, the isolation between the high voltage terminals T+, T− and the low voltage terminals T1 to T5 is broken.

Therefore, the lead wires of the high voltage terminals T+, T− may be coated with insulating material. However, secure isolation is difficult due to uneven coating. Further, it takes cost to coat the lead wires. Further, because typical insulating material includes volatile material and environmental load, using the insulating material is not preferable considering an effect on the environment.

Accordingly, an object of the present invention is to provide a low cost printed circuit board able to prevent a mixed conductive foreign particle from short-circuiting positive and negative terminals.

SUMMARY OF THE INVENTION

In order to attain the object, according to the present invention, there is provided a printed circuit board including:

a substrate;

a connector housing mounted on the substrate;

positive and negative high voltage terminals having lead wires of which one ends are projected from a sidewall of the connector housing, and connected to the substrate; and first insulating walls projected from the substrate and interposed between the positive and negative high voltage terminals, wherein projections of the first insulating walls are projected further away from the connector housing than the projected lead wires of the positive and negative high voltage terminals.

Preferably, the printed circuit board further includes:

low voltage terminals interposed between the positive and negative high voltage terminals, one ends of lead wires of which being projected from the sidewall of the connector housing and connected to the substrate, said low voltage terminals being isolated from the positive and negative high voltage terminals;

slits respectively interposed between the positive high voltage terminal and the low voltage terminals, and between the negative high voltage terminal and the low voltage terminals; and a pair of cases for clipping and receiving the substrate, wherein the first insulating walls are so formed on one of the cases away from the connector housing as to be inserted into the slits.

Preferably, the printed circuit board further includes:

a pair of cases for clipping and receiving the substrate; and a second insulating wall projected from one of the cases nearer the connector housing than the other of the cases, wherein the second insulating wall is so formed as to be interposed between the positive and negative high voltage terminals.

Preferably, the first insulating walls are so formed as to be higher than the projected lead wires of the positive and negative high voltage terminals.

These and other objects, features, and advantages of the present invention will become more apparent upon reading of the following detailed description along with the accompanied drawings.

DETAILED DESCRIPTION OF THE PREFERRED EMBODIMENTS

Figure 1:
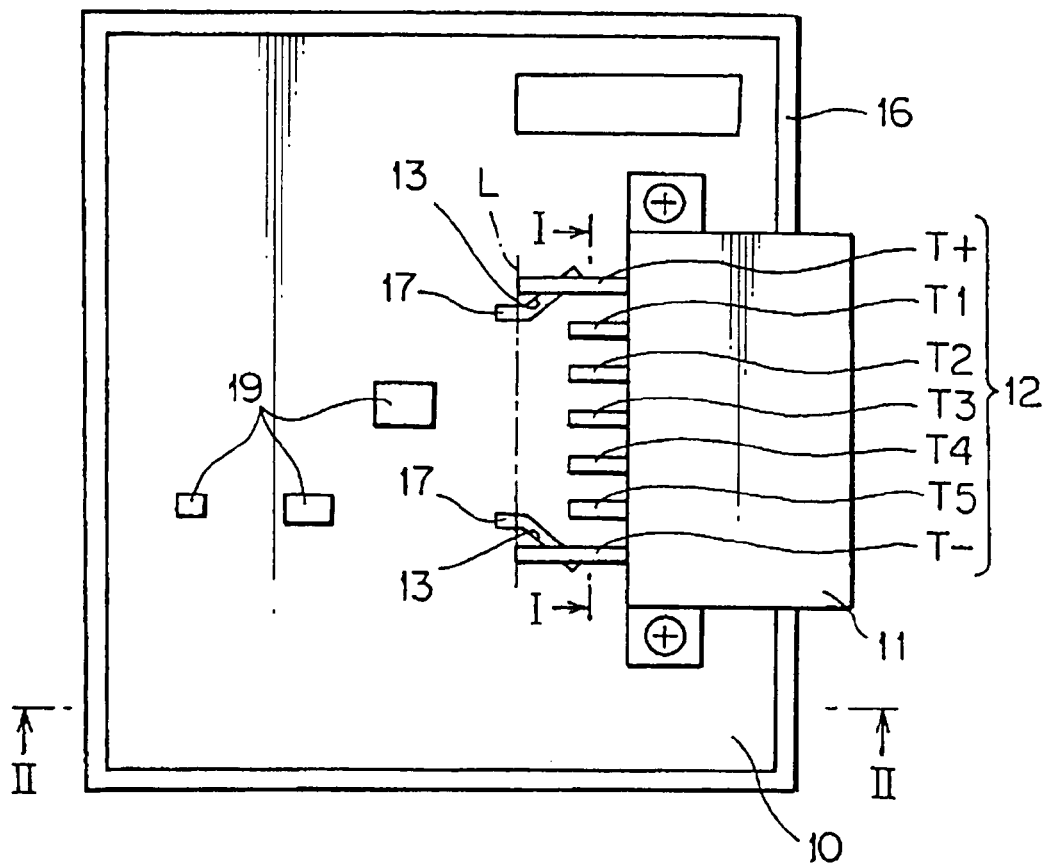
FIG. 1 is a top view showing an embodiment of a printed circuit board according to the present invention.

An embodiment of a printed circuit board according to the present invention will be explained with figures. As shown in FIG. 1, the printed circuit board includes a substrate 10, a connector housing 11 mounted on the substrate 10, and terminal fittings 12 received in terminal insertion holes formed on the connector housing 11. Surface-mounted components are mounted on the substrate 10.

The terminal fittings 12 include a high voltage positive terminal T+, and a high voltage negative terminal T− respectively connected to positive and negative terminals of a high voltage battery. The terminal fittings 12 also include low voltage terminals T1 to T5 electrically connected to a low voltage battery. The high voltage terminals T+, T− are isolated from the low voltage terminals T1 to T5.

Figure 2:
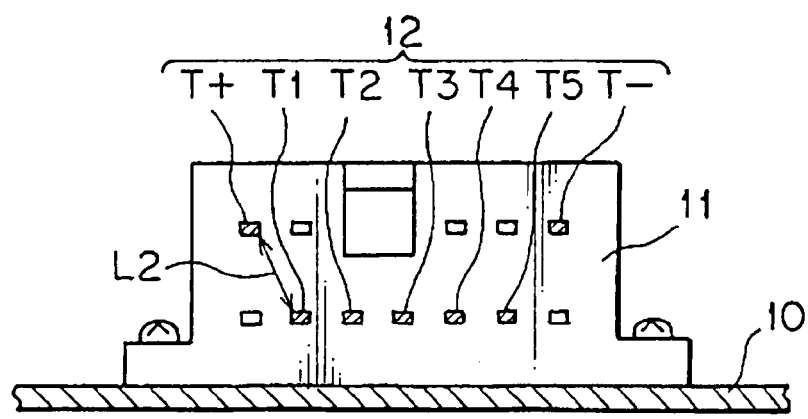
FIG. 2 is a sectional view of the printed circuit board taken on line I-I of FIG. 1.

As shown in FIG. 2, one ends of lead wires of the high voltage terminals T+, T− are projected from terminal insertion holes formed on an upper row of a sidewall of the connector housing 11. The other ends of the lead wires of the high voltage terminals T+, T− are connected to terminals on the substrate 10. One ends of lead wires of the low voltage terminals T1 to T5 are projected from terminal insertion holes formed on a lower row of the sidewall of the connector housing 11. The other ends of the lead wires of the low voltage terminals T1 to T5 are connected to the substrate 10.

As shown in FIG. 1, when seen from a top view, the low voltage terminals T1 to T5 are interposed between the high voltage terminals T+, T−, and projected from the connector housing 11. The high voltage terminals T+, T− are connected to the substrate 10 at positions further away from the connector housing 11 than the low voltage terminals T1 to T5.

A pair of slits 13 is formed on the substrate 10 and interposed between the high voltage terminals T+, T−. The slits 13 are formed further away from the connector housing 11 than the high voltage terminals T+, T−. Namely, as shown in FIG. 1, the slits 13 are extended further away from the connector housing 11 than an alternate long and short dash line L.

One of the slits 13 is interposed between the high voltage terminal T+ and the low voltage terminal T1. The low voltage terminal T1 is the nearest terminal to the high voltage terminal T+ among the low voltage terminals T1 to T5. This slit 13 is so formed as to ensure the isolation between the high voltage terminal T+ and the low voltage terminal T1 by elongating a distance along the substrate 10 between the high voltage terminal T+ and the low voltage terminal T1.

The other of the slit 13 is interposed between the high voltage terminal T− and the low voltage terminal T5. The low voltage terminal T5 is the nearest terminal to the high voltage terminal T− among the low voltage terminals T1 to T5. The other slit 13 is so formed as to ensure the isolation between the high voltage terminal T− and the low voltage terminal T5 by elongating a distance along the substrate 10 between the high voltage terminal T− and the low voltage terminal T5.

Figure 3:
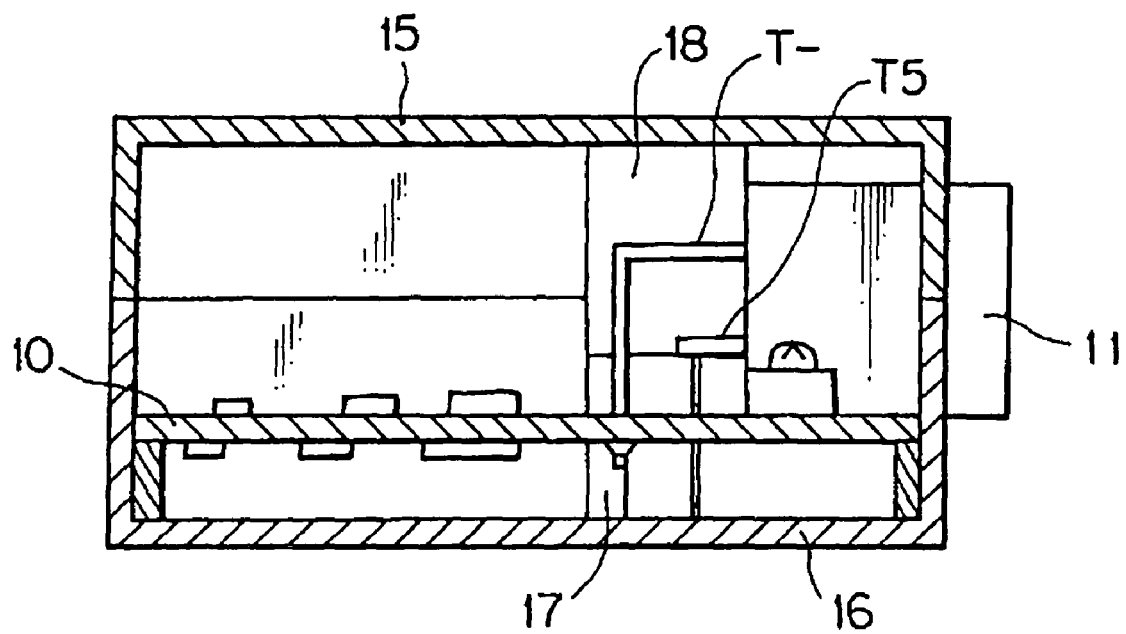
FIG. 3 is a sectional view of the printed circuit board taken on line II-II of FIG. 1.
Figure 4A:
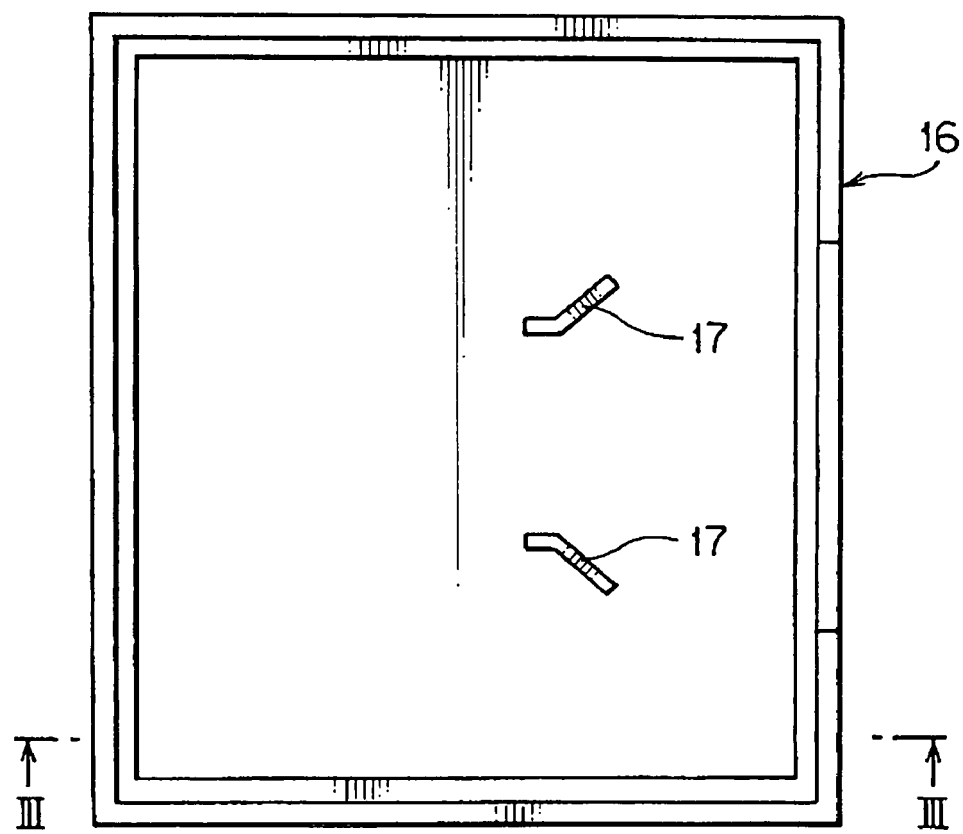
FIG. 4A is a top view showing a lower case of the printed circuit board shown in FIG. 1.
Figure 4B:
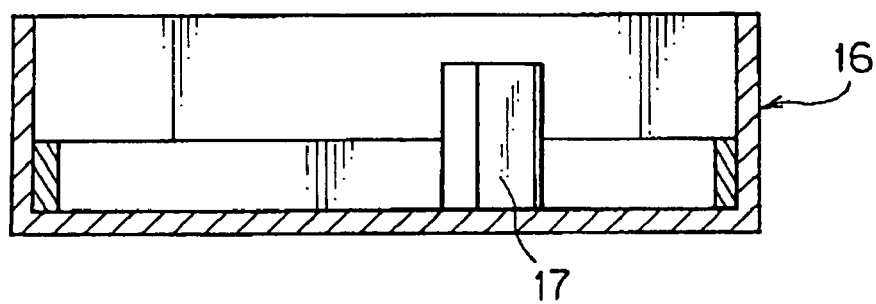
FIG. 4B is a sectional view of the lower case taken on line III-III of FIG. 4A.

The printed circuit board includes upper and lower cases 15, 16 (a pair of cases) for receiving the substrate 10 by clipping the substrate 10. Each of upper and lower cases 15, 16 is formed in a concave shape. The lower case 16 is further away from the connector housing 11 than the upper case 15. As shown in FIGS. 3, 4A, and 4B, a pair of first insulating walls 17 each having a convex shape is formed on the lower case 16.

The first insulating walls 17 are so formed on the lower case 16 as to be respectively inserted into the slits 13 and projected from the substrate 10.

Namely, the first insulating walls 17 projected from the substrate 10 are interposed between the high voltage terminals T+, T−, and disposed further away from the connector housing 11 than the high voltage terminals T+, T−.

Figure 5:
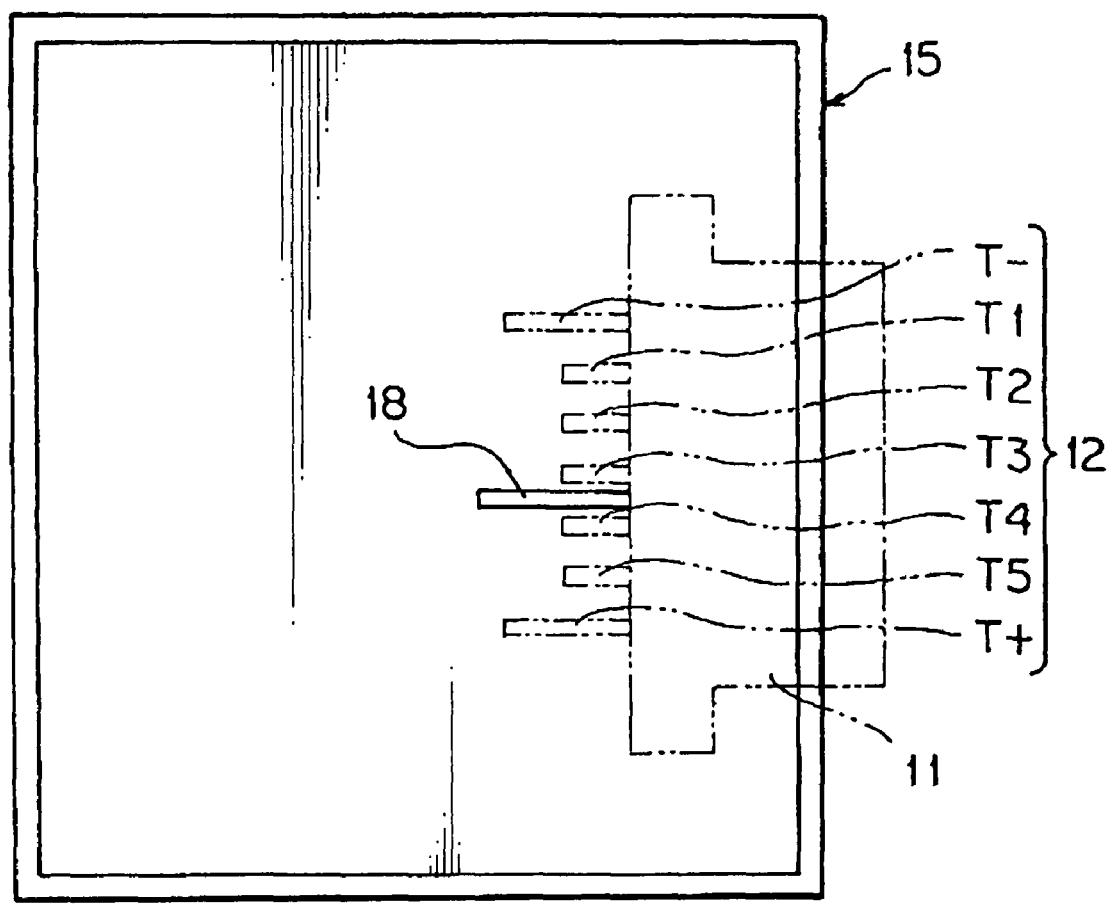
FIG. 5 is a top view showing an upper case of the printed circuit board shown in FIG. 1.

As shown in FIGS. 3 and 5, a second insulating wall 18 having a convex shape is formed on the upper case 15. The second insulating wall 18 is so formed as to be interposed between the high voltage terminals T+, T− while the cases 15, 16 receiving the substrate 10. The second insulating wall 18 is disposed further away from the connector housing 11 than the high voltage terminals T+, T−. Top ends of the first insulating walls 17 are at the same height as a bottom end of the second insulating wall 18, or the bottom end of the second insulating wall 18 is lower than the top ends of the first insulating walls 17.

Figure 6:
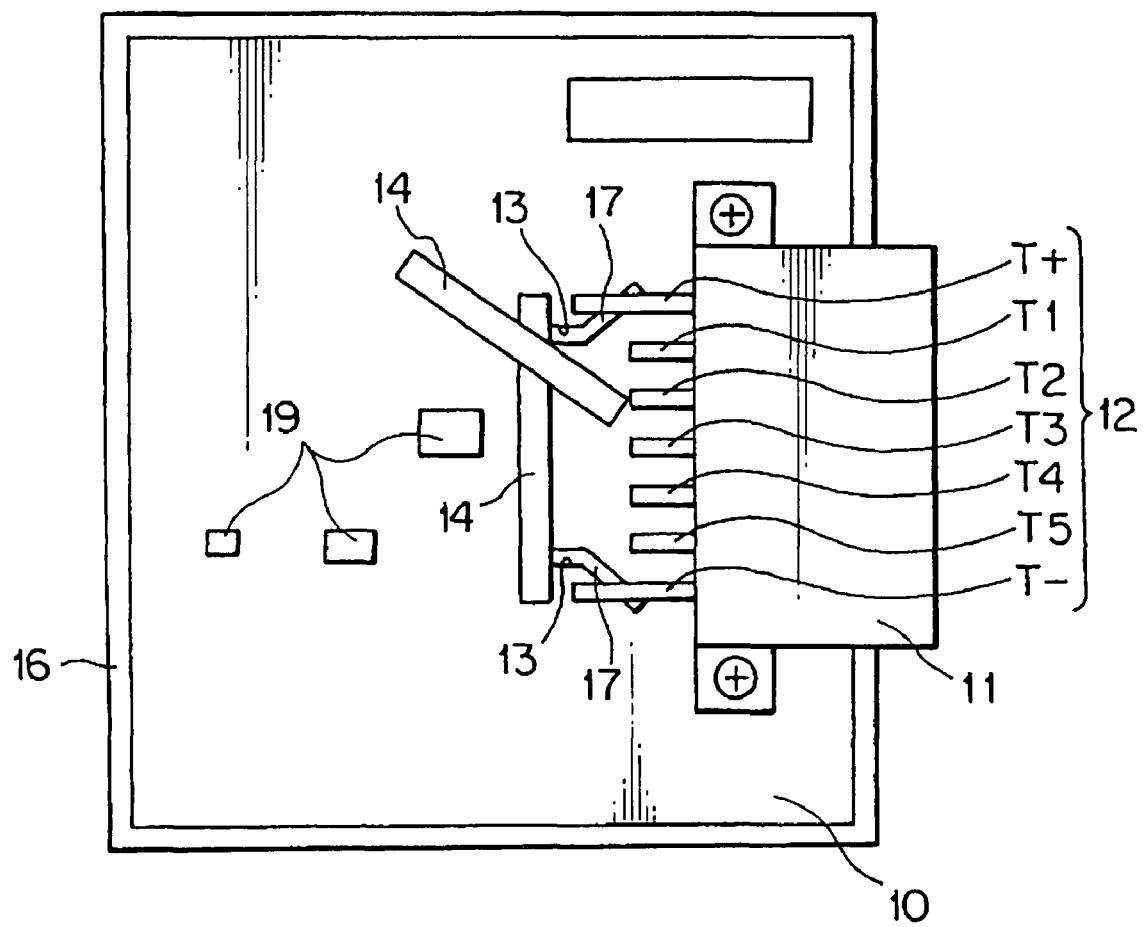
FIG. 6 is an explanatory view for explaining an effect of the printed circuit board shown in FIG. 1.

According to the printed circuit board described above, the first insulating walls 17 are projected from the substrate 10, and disposed further away from the connector housing 11 than the high voltage terminals T+, T−. Therefore, as shown in FIG. 6, if the conductive foreign particle 14 is mixed, the high voltage terminals T+, T− do not contact the conductive foreign particle 14 at the same time. Thus, a short-circuit between the high voltage terminals T+, T− due to mixing of the conductive foreign particle 14 is prevented at low cost.

Further, according to the printed circuit board described above, the first insulating walls 17 are so formed on the lower case 16 as to be inserted into the slits 13. Therefore, the slits 13 for elongating the distance along the substrate 10 between the high voltage terminals T+, T− and the low voltage terminals T1 to T5 are also used as the slits through which the first insulating walls 17 are inserted. Therefore, the slits 13 and the first insulating walls 17 are disposed on the same positions, and the printed circuit board can be a smaller size.

Further, according to the printed circuit board described above, the second insulating wall 18 is interposed between the high voltage terminals T+, T− while the upper and lower cases 15, 16 receive the substrate 10. Therefore, if the conductive foreign particle 14 jumps over the first insulating walls 17 due to vibration, the second insulating wall 18 prevents the conductive foreign particle 14 from contacting the high voltage terminals T+, T− at the same time. Thus, the short-circuit between the high voltage terminals T+, T− due to mixing of the conductive foreign particle 14 is further surely prevented.

Further, according to the printed circuit board described above, the second insulating wall 18 is disposed further away from the connector housing 11 than the high voltage terminals T+, T−. Therefore, if the conductive foreign particle 14 jumps over the first insulating walls 17 due to vibration, the second insulating wall 18 prevents the conductive foreign particle 14 from contacting the high voltage terminals T+, T− at the same time. Thus, the short-circuit between the high voltage terminals T+, T− due to mixing of the conductive foreign particle 14 is further surely prevented.

Further, according to the printed circuit board described above, the top ends of the first insulating walls 17 are at the same height as the bottom end of the second insulating wall 18, or the bottom end of the second insulating wall 18 is lower than the top ends of the first insulating walls 17. Therefore, if the conductive foreign particle 14 jumps into between the high voltage terminals T+, T− and the low voltage terminals T1 to T5 due to vibration, the second insulating wall 18 prevents the conductive foreign particle 14 from contacting the low voltage terminals T1 to T5 at the same time.

Figure 7:
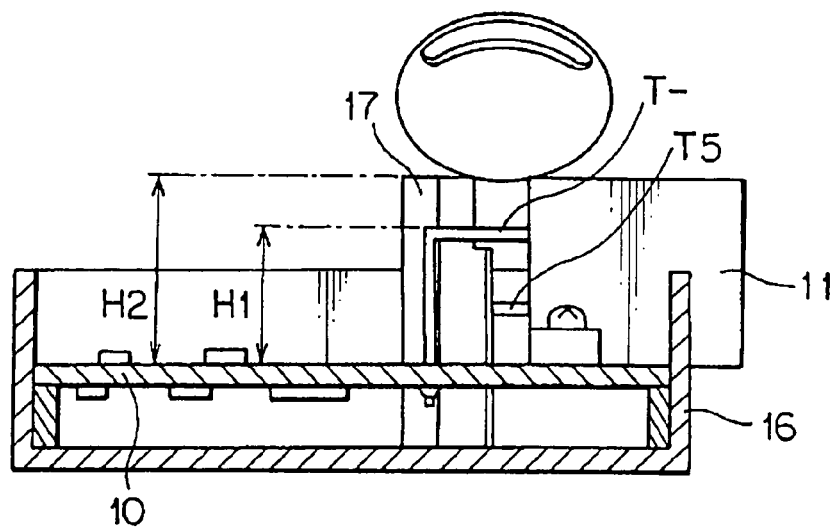
FIG. 7 is a sectional view showing another embodiment of the printed circuit board.
Figure 8:
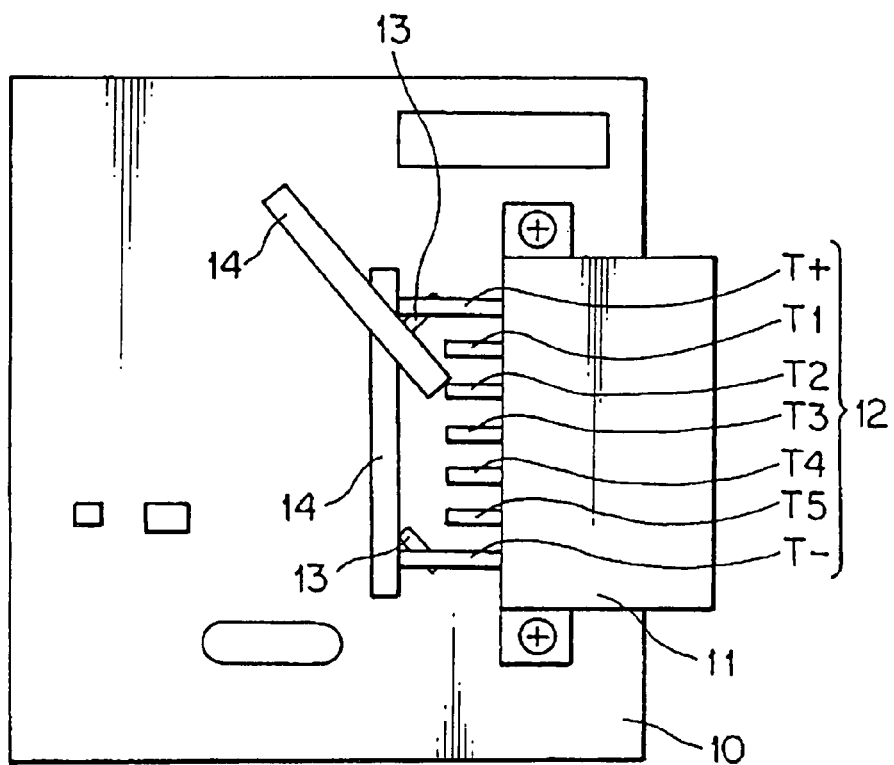
FIG. 8 is a top view showing a conventional printed circuit board.

Incidentally, according to the embodiment described above, the projection height of the first insulating walls 17 from the substrate 10 are lower than the projected lead wires of the high voltage terminals T+, T−. However, the present invention is not limited to this. For example, as shown in FIG. 7, height H2 of the first insulating walls 17 may be taller than a height H1 of the high voltage terminals T+, T−. As shown in FIG. 7, except portions under the projected lead wires of the high voltage terminals T+, T−, the first insulating walls 17 is higher than the high voltage terminals T+, T−.

According to the above, as shown in FIG. 7, the first insulating walls 17 prevent a worker's finger from touching the lead wires of the high voltage terminals T+, T− at the same time. A worker is prevented from receiving an electric shock at low cost.

Further, according to the embodiment described above, the lead wires of the low voltage terminals T1 to T5 are projected from the sidewall of the connector housing 11. However, the present invention is not limited to this. For example, only the lead wires of the high voltage terminals T+, T− may be projected from the sidewall of the connector housing 11. In this case, only one first insulating wall 17 may be interposed between the high voltage terminals T+, T−.

Further, according to the embodiment described above, the first insulating walls 17 are formed on the lower case 16, and inserted into the slits 13 on the substrate 10. However, the present invention is not limited to this. For example, insulating members as the first insulating walls 17 may be mounted on the substrate 10.

Further, according to the embodiment described above, the second insulating wall 18 is disposed further away from the connector housing 11 than the high voltage terminals T+, T−. However, the present invention is not limited to this. As long as the second insulating wall 18 is interposed between the high voltage terminals T+, T− while the upper and lower cases 15, 16 receives the substrate 10, the second insulating wall 18 may not be disposed further away from the connector housing 11 than the high voltage terminals T+, T−.

Further, as shown in FIG. 3, preferably, the bottom end of the second insulating wall 18 is at the same height as the top ends of the first insulating walls 17, or lower than the top ends of the first insulating walls 17. However, the present invention is not limited to this. The bottom end of the second insulating wall 18 may be higher than the top ends of the first insulating walls 17.

Further, as shown in FIG. 3, preferably, the second insulating wall 18 is disposed as near as possible to the connector housing 11. However, the present invention is not limited to this. The connector housing 11 may be separated from the connector housing 11.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A printed circuit board, comprising:
   a substrate;
   a connector housing mounted on the substrate;
   positive and negative high voltage terminals having lead wires of which one ends are projected away from a sidewall of the connector housing, folded toward the substrate, and connected to the substrate;
   low voltage terminals interposed between the positive and negative high voltage terminals, one ends of lead wires of which being projected from the sidewall of the connector housing and connected to the substrate, said low voltage terminals being isolated from the positive and negative high voltage terminals;
   first insulating walls projected from a lower case and interposed between the positive and negative high voltage terminals;
   slits respectively interposed between the positive high voltage terminal and the low voltage terminals, and between the negative high voltage terminal and the low voltage terminals; and
   a pair of cases for clipping and receiving the substrate,
   wherein the first insulating walls are so formed on one of the cases away from the connector housing as to be inserted into the slits,
   wherein the first insulating walls are projected further away from the connector housing than the folded parts of the projected lead wires of the positive and negative high voltage terminals,
   wherein the first insulating walls are inserted into the slits and projected from the substrate, and
   wherein the slits are formed further away from the connector housing than the positive and negative high voltage terminals.

2. The printed circuit board as claimed in claim 1, further comprising:
   a second insulating wall projected from one of the cases nearer the connector housing than the other of the cases,
   wherein the second insulating wall is so formed as to be interposed between the positive and negative high voltage terminals.

3. The printed circuit board as claimed in claim 1,
   wherein the first insulating walls are so formed as to be higher than the projected lead wires of the positive and negative high voltage terminals.

* * * * *